(12) United States Patent
Tan et al.

(10) Patent No.: US 7,547,922 B2
(45) Date of Patent: Jun. 16, 2009

(54) LIGHT-EMITTING DIODE ASSEMBLY

(75) Inventors: Li-Kuang Tan, Taipei Hsien (TW);
Yeu-Lih Lin, Taipei Hsien (TW);
Tseng-Hsiang Hu, Taipei Hsien (TW)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 115 days.

(21) Appl. No.: 11/687,132

(22) Filed: Mar. 16, 2007

(65) Prior Publication Data

US 2008/0157100 A1      Jul. 3, 2008

(30) Foreign Application Priority Data

Dec. 29, 2006   (CN) .................. 2006 1 0064609

(51) Int. Cl.
*H01L 29/18*      (2006.01)

(52) U.S. Cl. ..................... 257/88; 257/706; 257/707

(58) Field of Classification Search .................. 257/88, 257/706, 707

See application file for complete search history.

(56) References Cited

U.S. PATENT DOCUMENTS

| 6,864,513 | B2 | 3/2005 | Lin et al. | |
|---|---|---|---|---|
| 2003/0048641 | A1* | 3/2003 | Alexanderson et al. | 362/470 |
| 2004/0041757 | A1 | 3/2004 | Yang et al. | |
| 2006/0141851 | A1* | 6/2006 | Matsui et al. | 439/490 |

FOREIGN PATENT DOCUMENTS

| CN | 1516088 A | 7/2004 |
|---|---|---|
| CN | 1697207 A | 11/2005 |

* cited by examiner

*Primary Examiner*—Trung Dang
(74) *Attorney, Agent, or Firm*—Frank R. Niranjan

(57) ABSTRACT

A light emitting diode (LED) assembly includes at least an LED (102), a substrate (20), a heat dissipation apparatus (40) and at least one securing frame (30). The substrate forms a set of electrical circuitry (22) thereon. The at least one LED is arranged on a side of the substrate and electrically connected with the set of electrical circuitry of the substrate. The heat dissipation apparatus is arranged on an opposite side of the substrate. The securing frame includes a pressing portion (32) securing the substrate with the heat dissipation apparatus detachably.

17 Claims, 5 Drawing Sheets

LIGHT-EMITTING DIODE ASSEMBLY

BACKGROUND OF THE INVENTION

1. Field of the Invention

The present invention relates generally to light-emitting diode (LED) assemblies, and more particularly to an LED assembly with a heat dissipation apparatus which can be easily assembled and disassembled.

2. Description of Related Art

Light-emitting diode (LED) is a highly efficient light source currently used widely in such fields as automotive transport, display screens, and traffic control indication. When the LED gives off light, heat is accordingly produced. Generally an LED assembly includes an LED array which has a plurality of LEDs being fixedly mounted on a printed circuit board (PCB) by soldering. A heat sink made of metal, such as aluminum or copper, is fixedly assembled with the PCB to remove the heat generated by the LEDs. However, after the LED assembly is assembled, the components of the LED assembly are integral and cannot easily be separated. When a component of the LED assembly is damaged the other components remaining good cannot be recycled and thus waste is unavoidable as the LED assembly is difficult to detach without damaging it.

Therefore, it is desirable to provide an LED assembly wherein one or more of the foregoing disadvantages may be overcome or at least alleviated.

SUMMARY OF THE INVENTION

The present invention relates to a light-emitting diode (LED) assembly. The LED assembly includes at least one LED, a substrate, a heat dissipation apparatus and at least one securing frame. The substrate has circuitry formed thereon. The at least one LED is arranged on a side of the substrate and is electrically connected with the circuitry of the substrate. The heat dissipation apparatus is arranged on an opposite side of the substrate. The at least one securing frame includes a pressing portion detachably securing the substrate to the heat dissipation apparatus.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present light-emitting diode (LED) assembly can be better understood with reference to the following drawings. The components in the drawings are not necessarily drawn to scale, the emphasis instead being placed upon clearly illustrating the principles of the present LED assembly. Moreover, in the drawings, like reference numerals designate corresponding parts throughout the several views.

DETAILED DESCRIPTION OF THE INVENTION

Figure 1:
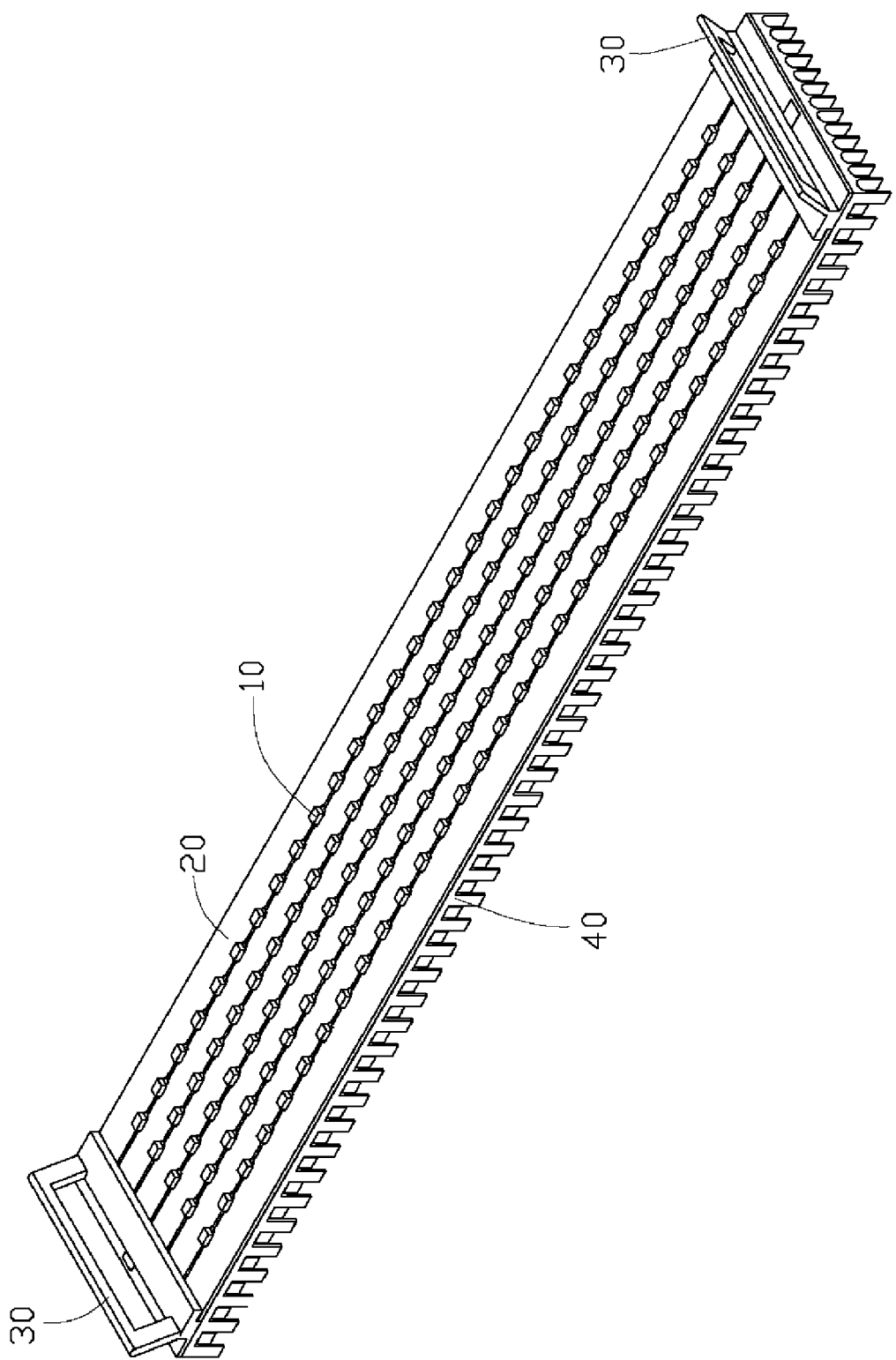
FIG. 1 is an assembled, isometric view of an LED assembly in accordance with a first embodiment of the present invention.

FIG. 1 illustrates a light-emitting diode (LED) assembly in accordance with a first embodiment of the present invention. The LED assembly includes an LED array 10, a substrate 20, a heat dissipation apparatus 40, and a pair of securing frames 30.

Figure 2:
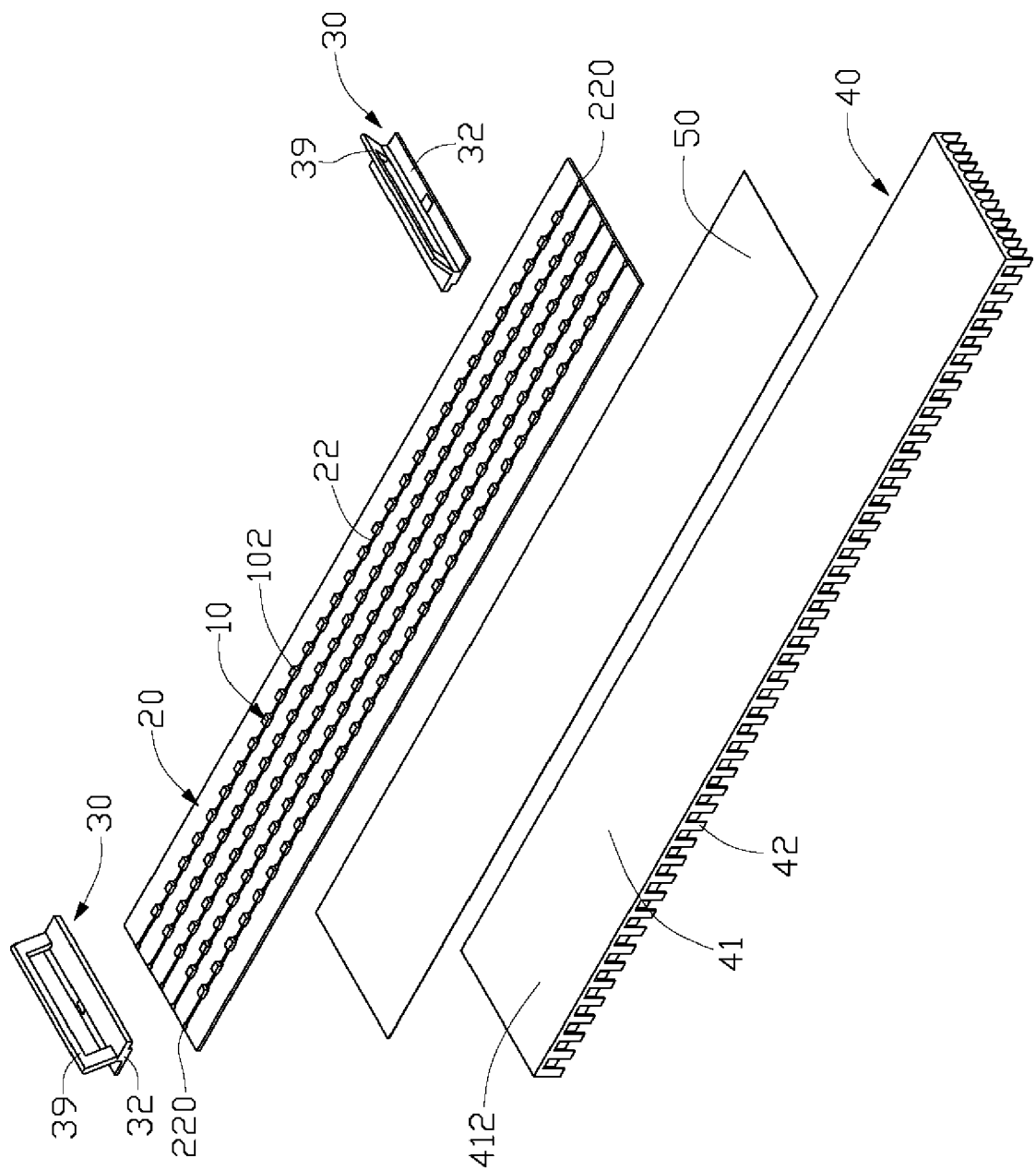
FIG. 2 shows an explored view of the LED assembly of FIG. 1.
Figure 3:
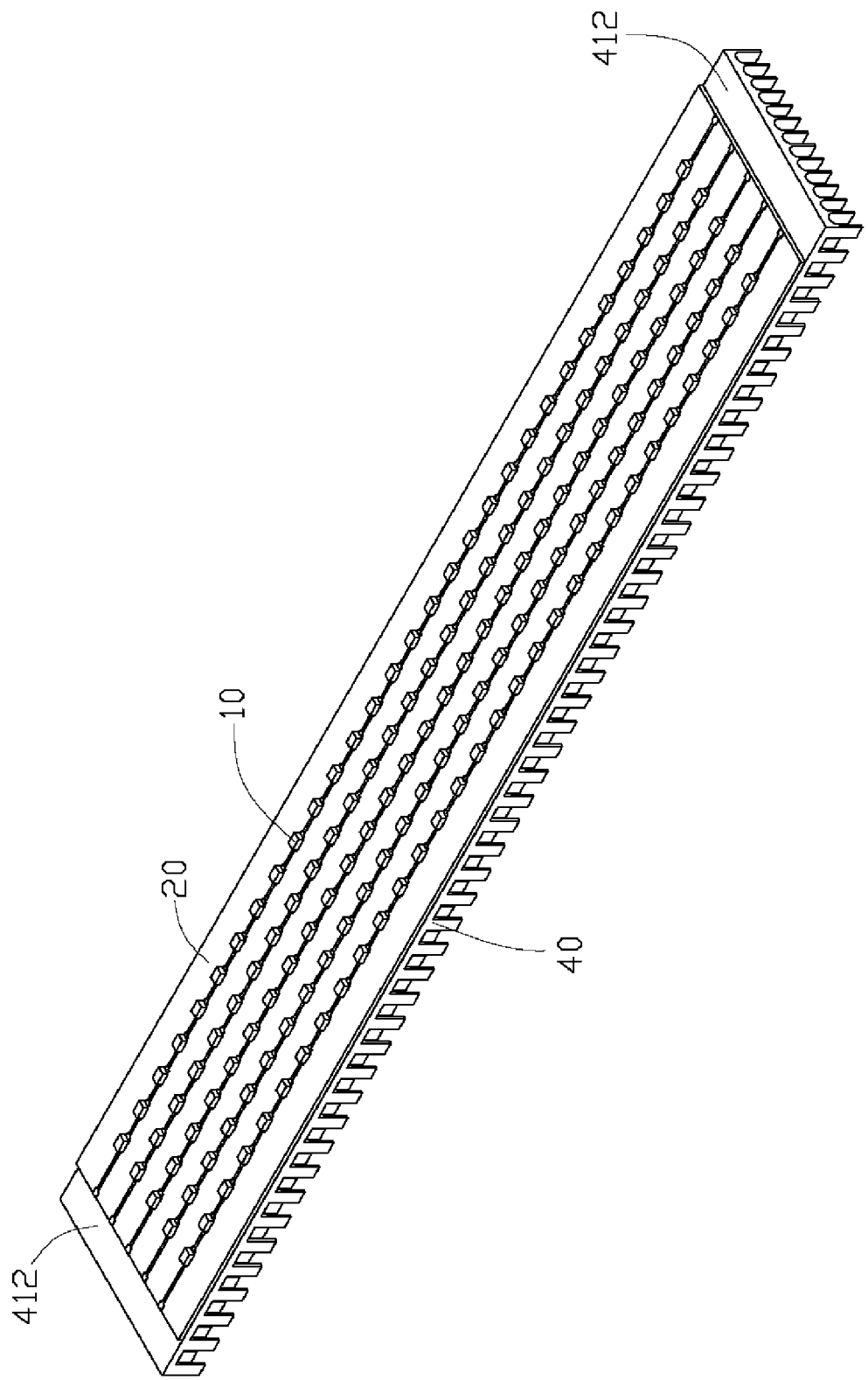
FIG. 3 is a partially assembled view of FIG. 1, with securing frames of the LED assembly being removed for clarity.
Figure 4:
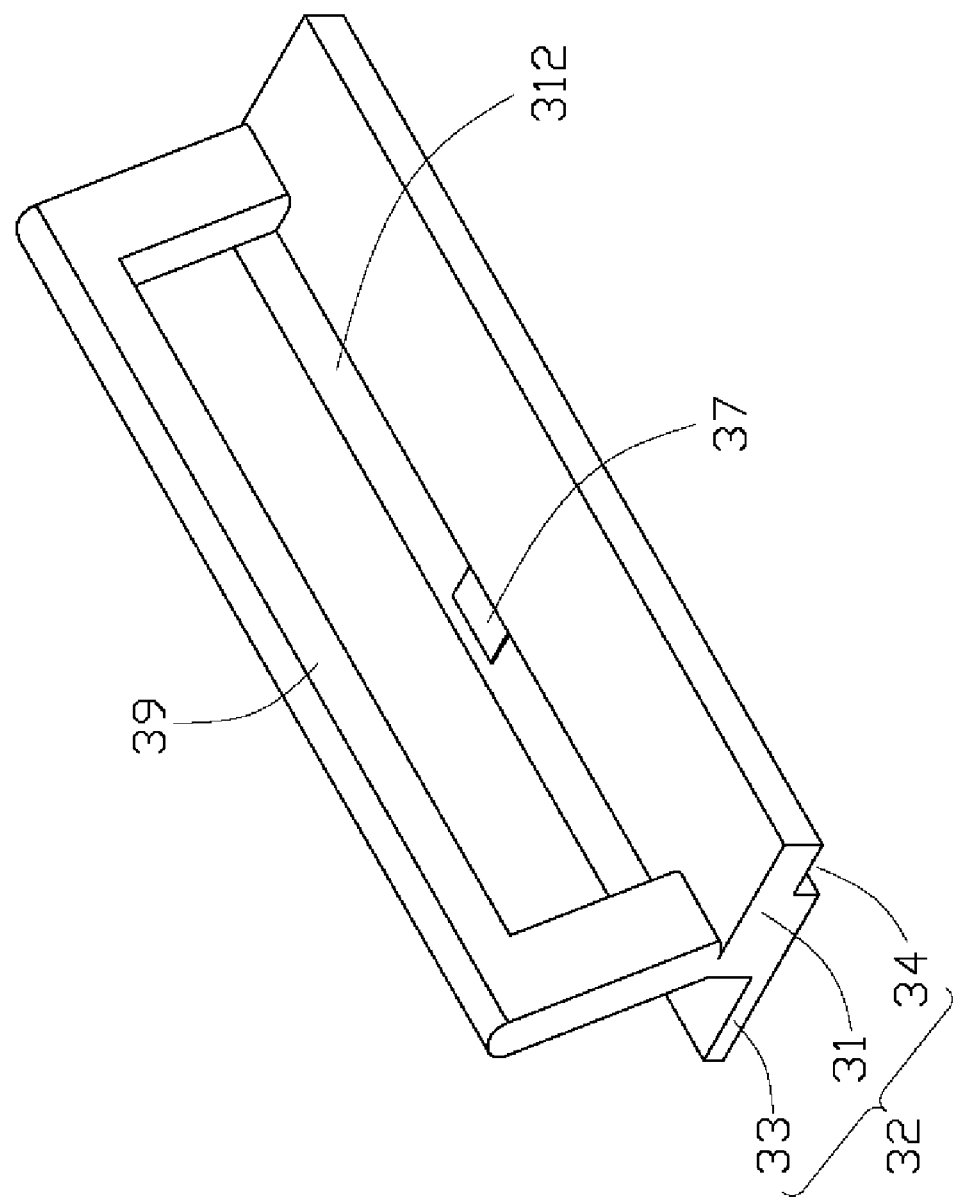
FIG. 4 is an enlarged, isometric view of the securing frame of FIG. 1.
Figure 5:
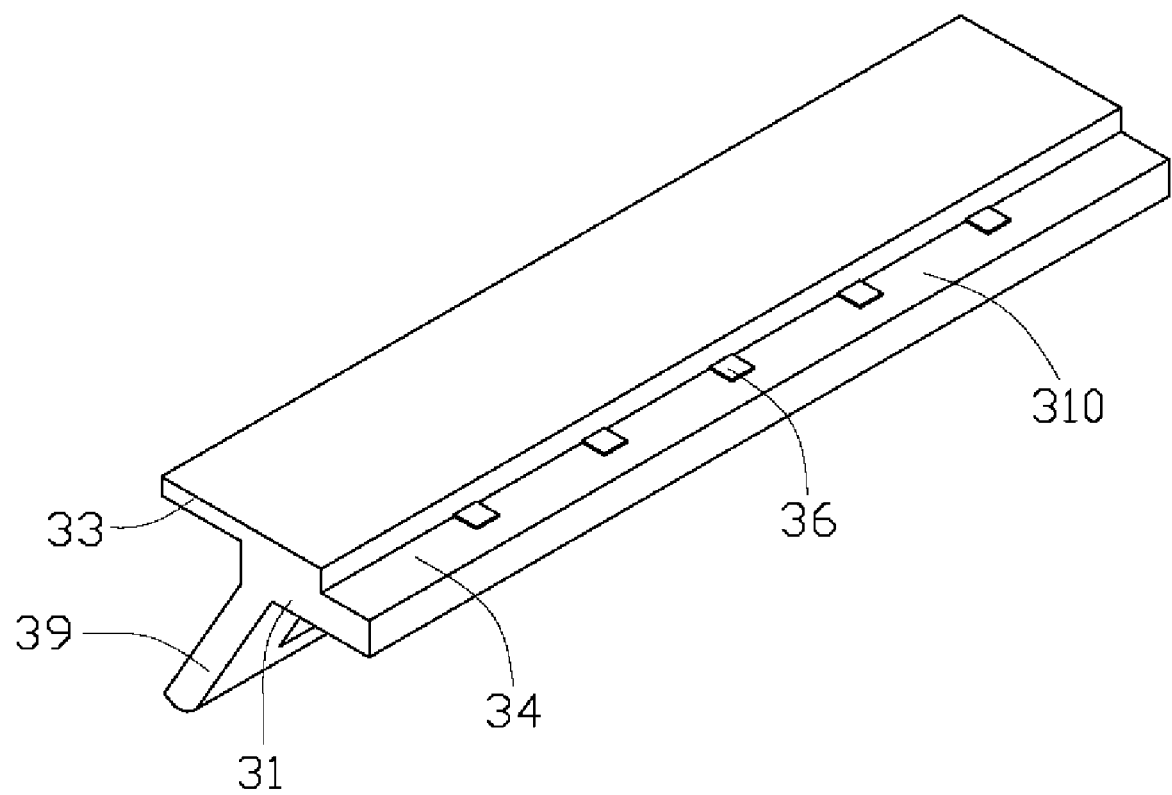
FIG. 5 is similar to FIG. 4, but shows the securing frame viewed from another aspect.

As shown in FIGS. 2-3, the LED array 10 includes a plurality of LEDs 102 arranged in a mode of matrix which includes a plurality of crossed lines and rows. In this embodiment, there are five LED lines. Each line includes several LEDs 102. The substrate 20 is planar and thin. Five sets of electrical circuitry 22 are formed on an upper surface of the substrate 20 corresponding to the number of lines of the LED array 10. The sets of electrical circuitry 22 are parallel to each other. Each set of electrical circuitry 22 forms a plurality of terminals (not shown) corresponding to the number of LEDs 102 in each line of the LED array 10. The terminals are used for electrically connecting with the LEDs 102 to supply current to the LED array 10. A pair of ends 220 are formed on the left and rights sides of each set of electrical circuitry 22. When assembled, each LED 102 is attached to the upper surface of the substrate 20 and is electrically connected with a corresponding terminal of the sets of electrical circuitry 22 of the substrate 20 through wire bonding or flip chip. In this embodiment, the substrate 20 is a metal core printed circuit board (MCPCB). To form the MCPCB, a planar-shaped metal plate which is made of aluminum (Al) is used. Alternatively, the metal plate can be made of other materials having higher heat conductivity, such as copper (Cu) or its alloys. Then an insulating layer is formed on the outer surface of the metal plate. The insulating layer is then coated with a copper foil layer through sputtering, hot-press, electroless copper deposition or electrodeposition. Finally the sets of electrical circuitry 22 are formed by photoresist coating, exposing and etching the copper foil layer. It is to be understood that the substrate 20 can be other kinds of printed circuit boards, such as metal base printed boards, ceramic substrate printed boards and so on.

The heat dissipation apparatus 40 is arranged under the substrate 20. The heat dissipation apparatus 40 as shown in this embodiment is an extruded aluminum fin-type heat sink. Alternatively, the heat dissipation apparatus 40 can be a plate-type heat pipe or a vapor chamber which has a relatively high heat transfer capability due to the phase change mechanism used. Also the heat dissipation apparatus 40 can be a cold plate in which a flow channel is defined for passage of working fluid. Also the heat dissipation apparatus 40 can be made of a highly thermally conductive material, such as copper or its alloys. The heat dissipation apparatus 40 includes a chassis 41 and a plurality of pin fins 42 extending downwardly from the chassis 41. The fins 42 are used for increasing the heat dissipation area of the heat dissipation apparatus 40. Alternatively, the fins 42 can be flat shaped. The fins 42 and the chassis 41 can be formed separately, and then connected together by soldering. The chassis 41 of the heat dissipation apparatus 40 has a top surface 412 thermally attached to a lower surface of the substrate 20. To reduce thermal resistance between the heat dissipation apparatus 40 and the substrate 20, thermal interface material 50, such as thermal grease, can be applied between the chassis 41 and the substrate 20. The top surface 412 of the chassis 41 has an area larger than that of the lower surface of the substrate 20 with a width approximately the same as that of the lower side of the substrate 20 and a length larger than that of the lower side of the substrate 20. When assembled the substrate 20 is located on a middle of the top surface 412 of the chassis 41. The left lateral side and the right lateral side of the top surface 412 of the chassis 41 are not covered by the substrate 20 and thus are exposed for mounting of the securing frames 30 thereon.

The securing frames 30 are made from plastic materials using injection molding. Each securing frame 30 includes a pressing portion 32 and an operating portion 39. The pressing portion 32 is approximately a planar-shaped plate. The pressing portion 32 includes a first part 33 pressing on the heat dissipation apparatus 40 and a second part 34 pressing on the substrate 20. The first and the second parts 33, 34 are rectangle-shaped. The first and second parts 33, 34 are stacked and partly overlap each other to form an overlapping part 31. Thus the second part 34 is higher than the first part 33, and the two parts 33, 34 of each securing frame 30 have a height difference of about the same size as a thickness of the substrate 20. When the securing frame 30 is assembled, the first part 33 of each securing frame 30 abuts one lateral side of the chassis 41, and the second part 34 abuts a side of the substrate 20. As the first and second parts 34 have a height difference being approximately the same length as the thickness of the substrate 20, when the securing frame 30 is mounted on the heat dissipation apparatus 40 a gap which is defined between the second part 34 of the securing frame 30 and the top surface 412 of the chassis 41 of the heat dissipation apparatus 40 receives one side of the substrate 20 therein. The operating portion 39 of each securing frame 30 extends upwardly and aslant from the overlapping part 31 of the pressing portion 32. The operating portion 39 is used for conveniently attaching or detaching the securing frame 30.

A first contact 37 is formed on a top surface of the first part 33 of each securing frame 30. Five second contacts 36 are formed on a bottom surface of the second part 34 of each securing frame 30. The second contacts 36 are inline with each other and evenly spaced. Each second contact 36 is located corresponding to a position of a corresponding set of electrical circuitry 22. The first and second contacts 37, 36 are made of copper foil, and each contact 37, 36 is a square-shaped piece. The five second contacts 36 are electrically connected with the first contact 37. Conducting wires are embedded in the pressing portion 32 of the securing frame 30 to electrically connect the first contact 37 with the second contacts 36.

When assembled, the substrate 20 with the LED array 10 mounted thereon is arranged on the middle of the top surface 412 of the chassis 41. The securing frames 30 are arranged on the left and right lateral sides of the chassis 41, respectively. Each second contact 36 of the left securing frame 30 is electrically connected with a left end 220 of a corresponding set of electrical circuitry 22, and each second contact 36 of the right securing frame 30 is electrically connected with a right end 220 of the corresponding set of electrical circuitry 22. Thus the two ends 220 of each set of electrical circuitry 22 are electrically connected with the second contacts 36 of the securing frames 30. A power source (not shown) for supplying current to the LEDs 102 is electrically connected to the first contacts 37 of the securing frames 30. A positive pole of the power source is connected with the first contact 37 of one securing frame 30, and a negative pole of the power source is connected with the first contact 37 of the other securing frame 30. Thus the contacts 36, 37, the sets of electrical circuitry 22 and the LEDs 102 form a circuit, and thus currents are applied to the LEDs 102 through the contacts 36, 37 of the securing frames 30 and the sets of electrical circuitry 22 of the substrate 20.

For securing the heat dissipation apparatus 40 and the substrate 20 together, adhesive (preferable, pressure-sensitive adhesive) can be coated on the bottom surfaces of the first and second parts 33, 34 of the pressing portions 32 of the securing frames 30. Thus the securing frames 30 secure the heat dissipation apparatus 40 to the substrate 20 through adhesive bonding. When any component of the LED assembly 10, such as the LED 102 or the heat dissipation apparatus 40, is damaged, the securing frames 30 can be easily detached from the LED assembly by putting a pulling force on the operating portion 39 of each securing frame 30. Thus the other components remain useable even after being disassembled from the LED assembly, and can be recycled. A replaced component of the damaged component can be assembled to other components to form a new LED assembly. The new LED assembly can also be connected together by using the securing frames 30. Putting a force on the securing frames 30 to press the securing frames 30 on the heat dissipation apparatus 40 and the substrate 20 to bond them together. Thus the LED assembly can be attached or detached easily, and replacement of components is easily and waste is avoided. The securing frames 30 are used to secure the substrate 20 to the heat dissipation apparatus 40 detachably, it is not limited to bonding as the previous embodiment discussed. The securing frames 30 also can secure the substrate 20 to the heat dissipation apparatus 40 by a mechanical connecting mechanism. For example, securing holes are defined in the heat dissipation apparatus 40 and the substrate 20, and hooks are formed on the securing frames and respectively resiliently engage into the securing holes of the heat dissipation apparatus and the substrate to assembly the heat dissipation apparatus and the substrate together.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light-emitting diode (LED) assembly, comprising:
   a substrate with a set of electrical circuitry being formed thereon;
   at least one LED being arranged on first side of the substrate and electrically connected with the set of electrical circuitry of the substrate;
   a heat dissipation apparatus being arranged on a second side of the substrate opposite to the first side of the substrate; and
   at least one securing frame having a pressing portion securing the substrate with the heat dissipation apparatus detachably;
   wherein the pressing portion comprises a first part abutting the heat dissipation apparatus and a second part abutting the substrate; and
   wherein the first part forms a first contact for being electrically connected with a power source, and the second part forms at least a second contact being electrically connected with the set of electrical circuitry of the substrate and being electrically connected with the first contact of the first part.

2. The assembly of claim 1, wherein the pressing portion is secured with the heat dissipation apparatus and the substrate by adhesive bonding.

3. The assembly of claim 1, wherein the first and second parts have a height difference substantially equal to a thickness of the substrate, and thus a gap is defined between the second part and the heat sink capable of receiving the substrate therein.

4. The assembly of claim 1, wherein the at least one LED comprises a plurality of lines, and each line includes a plurality of LEDs, the substrate forming a plurality of sets of electrical circuitry corresponding to the number of the lines, each set of electrical circuitry forming two ends on two opposite sides of the substrate.

5. The assembly of claim 4, wherein the at least one securing frame comprises two securing frames arranged on the two opposite sides of the substrate, the two ends of each set of electrical circuitry being electrically connected with the second contacts of the two securing frames, respectively.

6. The assembly of claim 5, wherein each securing frame forms a plurality of second contacts corresponding to the number of the sets of electrical circuitry.

7. The assembly of claim 1, wherein the contacts of the securing frames are made of copper foil, and each contact is a square-shaped piece.

8. The assembly of claim 1, wherein the at least one securing frame further comprises an operating portion extending upwardly and aslant from the pressing portion.

9. The assembly of claim 1, wherein the heat dissipation apparatus has a surface thermally contacting with the substrate, the surface having an area larger than that of the substrate with an outer periphery thereof being not covered by the substrate, the at least one securing frame being arranged on the outer periphery of the surface of the heat dissipation apparatus.

10. The assembly of claim 1, wherein the heat dissipation apparatus is one of the following devices: fin-type heat sink, plate-type heat pipe, vapor chamber and cold plate.

11. The assembly of claim 1, wherein the pressing portion is secured with the heat dissipation apparatus and substrate by a mechanical connecting mechanism.

12. The assembly of claim 11, wherein the mechanical connecting mechanism comprises holes defined in the heat dissipation apparatus and the substrate, and hooks formed on the at least one securing frame and resiliently engaging in the holes.

13. An LED assembly comprising:
a substrate having a top surface and an opposite bottom surface;
a plurality of LEDs arranged in a matrix and mounted on the top surface of the substrate;
a heat sink thermally connecting with the bottom surface of the substrate so that heat generated by the LEDs is dissipated by the heat sink, wherein the substrate is shorter than the heat sink so two end portions of the heat sink are exposed; and
a pair of securing frames being detachably mounted on the two end portions of the heat sink and removably securing the substrate to the heat sink;
wherein a bottom surface of each of the securing frames is provided with a pressure sensitive adhesive which removably bonds each of the securing frames, the heat sink and the substrate together; and
wherein the bottom surface of each of the securing frames is formed as having a step-like configuration so that a gap is defined in the bottom surface to receive an end of the substrate therein.

14. The assembly of claim 13, wherein the securing frames are electrically connected with the substrate so that electrical power can be supplied to the substrate via the securing frames.

15. The assembly of claim 13, wherein each of the securing frames is provided with an operating portion for facilitating a pulling force to be exerted to each of the securing frames thereby removing the securing frames from the heat sink and the substrate.

16. The assembly of claim 13 further comprising a thermal interface material disposed between the bottom surface of the substrate and the heat sink, and wherein the heat sink has fins extending away from the substrate.

17. An LED assembly comprising:
a substrate having a top surface and an opposite bottom surface;
a plurality of LEDs arranged in a matrix and mounted on the top surface of the substrate;
a heat sink thermally connecting with the bottom surface of the substrate so that heat generated by the LEDs is dissipated by the heat sink, wherein the substrate is shorter than the heat sink so two end portions of the heat sink are exposed; and
a pair of securing frames being detachably mounted on the two end portions of the heat sink and removably securing the substrate to the heat sink;
wherein a bottom surface of each of the securing frames is provided with a pressure sensitive adhesive which removably bonds each of the securing frames, the heat sink and the substrate together; and
wherein each of the securing frames is provided with an operating portion for facilitating a pulling force to be exerted to each of the securing frames thereby removing the securing frames from the heat sink and the substrate.

* * * * *